US007452638B2

(12) United States Patent
Yu et al.

(10) Patent No.: US 7,452,638 B2
(45) Date of Patent: Nov. 18, 2008

(54) NEGATIVE-WORKING RADIATION-SENSITIVE COMPOSITIONS AND IMAGEABLE MATERIALS

(75) Inventors: Jianfei Yu, Fort Collins, CO (US); Kevin B. Ray, Fort Collins, CO (US); Shashikant Saraiya, Fort Collins, CO (US); Thomas R. Jordan, Windsor, CO (US); Paul R. West, Fort Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 130 days.

(21) Appl. No.: 11/532,647

(22) Filed: Sep. 18, 2006

(65) Prior Publication Data

US 2008/0070152 A1    Mar. 20, 2008

(51) Int. Cl.
*G03F 7/035* (2006.01)
(52) U.S. Cl. .............. 430/17; 430/281.1; 430/325; 430/906; 430/910
(58) Field of Classification Search .......... 430/281.1, 430/906, 910, 17, 325
See application file for complete search history.

(56) References Cited

U.S. PATENT DOCUMENTS

| 3,684,758 | A | 8/1972 | Honig et al. |
| 4,644,030 | A | 2/1987 | Loewrigkeit et al. |
| 5,173,526 | A | 12/1992 | Vijayendran et al. |
| 6,569,603 | B2 | 5/2003 | Furukawa |
| 6,794,104 | B2 | 9/2004 | Tashiro |
| 7,279,255 | B2 * | 10/2007 | Tao et al. ............ 430/17 |

2007/0184380 A1    8/2007   Tao et al.

FOREIGN PATENT DOCUMENTS

| EP | 1 338 435 A2 | 8/2003 |
| JP | 2002-293882 | 9/2002 |
| WO | 2006/007270 | 1/2006 |

OTHER PUBLICATIONS

JP Abstract 2002-293882 (Oct. 9, 2002).
Ernest C. Galgoci et al, "Solvent-Free Urethane-Acrylic Hybrid Polymers For Coatings", *JCT Coatings Tech*, 2(13), 28-36 (Feb. 2005).
"Hybridur 870® Polymer Dispersion", bulletin, 125-0148 R3/Jul. 6, p. 1-6.
U.S. Appl. No. 11/441,601, filed May 26, 2006 titled *Negative-Working Radiation-Sensitive Compositions And Imageable Materials* by T.Tao et al.
U.S. Appl. No. 11/475,694, filed Jun. 27, 2006 titled *Negative-Working Radiation-Sensitive Compositions And Imageable Elements* by H. Munnelly et al.

* cited by examiner

*Primary Examiner*—Richard Schilling
(74) *Attorney, Agent, or Firm*—J. Lanny Tucker

(57) ABSTRACT

A radiating-sensitive composition and negative-working imageable element includes a free radically polymerizable component, an initiator composition capable of generating radicals sufficient to initiate polymerization of the free radically polymerizable component upon exposure to imaging radiation, a radiation absorbing compound, and particles of a poly(urethane-acrylic) hybrid that are distributed throughout the composition forming an imageable layer in the element. Imaging can be accomplished at a wide range of wavelengths from about 150 to about 1500 nm, and development can be accomplished using an organic solvent-based developer, warm water, plate cleaner, or on-press using a combination of a lithographic printing ink and a fountain solution.

26 Claims, No Drawings

NEGATIVE-WORKING RADIATION-SENSITIVE COMPOSITIONS AND IMAGEABLE MATERIALS

FIELD OF THE INVENTION

This invention relates to negative-working radiation-sensitive compositions and imageable elements such as negative-working printing lithographic printing plate precursors that have increased solvent resistance and excellent sensitivity, run-length, and shelf life. The invention also relates to methods of using these imageable elements.

BACKGROUND OF THE INVENTION

Radiation-sensitive compositions are routinely used in the preparation of imageable materials including lithographic printing plate precursors. Such compositions generally include a radiation-sensitive component, a radically polymerizable component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of from about 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and non-exposed regions are washed off during development. For positive-working printing plates, the exposed regions are dissolved in a developer and the non-exposed regions become an image.

Various negative-working radiation compositions and imageable elements containing reactive polymer binders are known in the art. Some of these compositions and elements are described for example in U.S. Pat. No. 6,569,603 (Furukawa), U.S. Pat. No. 6,309,792 (Hauck et al.), U.S. Pat. No. 6,582,882 (Pappas et al.), U.S. Pat. No. 6,893,797 (Munnelly et al.), and U.S. Pat. No. 6,787,281 (Tao et al.), U.S. Patent Application Publication 2003/0118939 (West et al.), and EP 1,079,276A1 (Lifka et al.), and EP 1,449,650A1 (Goto).

U.S. Pat. No. 6,794,104 (Tashiro) describes lithographic printing plate precursors containing particulate materials including particulate thermosetting resins. U.S. Pat. No. 5,173,526 (Vijayendran et al.) describes the use of aqueous polyurethane-vinyl polymer dispersions in flexographic methods.

Problem to be Solved

The various radiation sensitive compositions of the art can readily be used to prepare negative-working imageable elements. There is a need however to improve their chemical resistance, run-length, and shelf stability without a loss in imaging speed.

SUMMARY OF THE INVENTION

The present invention provides a radiation-sensitive composition comprising:
  a free radically polymerizable component,
  an initiator composition capable of generating radicals sufficient to initiate polymerization of the free radically polymerizable component upon exposure to imaging radiation,
  a radiation absorbing compound, and
  particles of a poly(urethane-acrylic) hybrid that are distributed throughout the composition.

This invention also provides a negative-working imageable element comprising a substrate having thereon an imageable layer comprising:
  a free radically polymerizable component,
  an initiator composition capable of generating radicals sufficient to initiate polymerization of the free radically polymerizable component upon exposure to imaging radiation,
  a radiation absorbing compound, and
  particles of a poly(urethane-acrylic) hybrid that are distributed throughout the imageable layer.

In addition, this invention provides a method of making an imaged element comprising:
  A) imagewise exposing the negative-working imageable element of this invention to form exposed and non-exposed regions,
  B) with or without a preheat step, developing the imagewise exposed element to remove only the non-exposed regions, and
  C) optionally heating the imaged and developed element or subjecting it to floodwise UV exposure.

We have found that the radiation sensitive compositions and negative-working imageable elements of this invention provide a number of advantages including improved resistance to press chemicals and improved shelf stability and run-length without loss in imaging properties such as imaging speed. We also unexpectedly found that the compositions and elements can be developed either off-press using organic solvent-based developers or on-press using water or simple plate cleaners. The compositions and elements can also be developed off-press using water (such as warm water), and on-press using combinations of lithographic printing inks and fountains solutions.

DETAILED DESCRIPTION OF THE INVENTION

Definitions

Unless the context indicates otherwise, when used herein, the term "radiation-sensitive composition", "imageable element", and "printing plate precursor" are meant to be references to embodiments of the present invention.

In addition, unless the context indicates otherwise, the various components described herein such as "radically polymerizable component", "radiation absorbing compound", "polymeric binder", "poly(urethane-acrylic) hybrid", "initiator", "co-initiator", and similar terms also refer to mixtures of such components. Thus, the use of the articles "a", "an", and "the" are not necessarily meant to refer to only a single component.

Moreover, unless otherwise indicated, percentages refer to percents by dry weight.

The imageable elements of this invention are generally "single-layer" imageable elements by which we mean that the elements contain only one layer that is essential for imaging, but such elements may also include one or more layers under or over (such as a topcoat) the imageable layer for various purposes.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

"Graft" polymer or copolymer refers to a polymer having a side chain that has a molecular weight of from about 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Radiation-Sensitive Compositions

One aspect of the present invention is a radiation-sensitive composition that may have any utility wherever there is a need for a coating that is polymerizable using suitable electromagnetic radiation, and particularly where it is desired to remove non-exposed regions of the coated and imaged composition. The radiation-sensitive compositions can be used to prepare imageable elements for use as printed circuit boards for integrated circuits (printing circuit boards), paint compositions, molding compositions, color filters, chemically amplified resists, imprint lithography, microelectronic and microoptical devices, and photomask lithography, and preferably printed forms such as lithographic printing plate precursors and imaged printing plates that are defined in more detail below.

The free radically polymerizable component used in the radiation-sensitive composition consists of one or more compounds that have one or more ethylenically unsaturated polymerizable or crosslinkable groups that can be polymerized or crosslinked using free radical initiation. For example, the free radically polymerizable component can be ethylenically unsaturated monomers, oligomers, and crosslinkable polymers, or various combinations of such compounds.

Thus, suitable ethylenically unsaturated compounds that can be polymerized or crosslinked include ethylenically unsaturated polymerizable monomers that have one or more of the polymerizable groups, including unsaturated esters of alcohols, such as (meth)acrylate esters of polyols. Oligomers and/or prepolymers, such as urethane (meth)acrylates, epoxide(meth)acrylates, polyester(meth)acrylates, polyether (meth)acrylates, free-radical crosslinkable polymers, and unsaturated polyester resins can also be used. In some embodiments, the radically polymerizable component may comprise carboxy groups.

Particularly useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers, or combinations of these classes of materials. More particularly useful free radically polymerizable compounds include those derived from urea urethane (meth)acrylates or urethane(meth)acrylates having multiple polymerizable groups. For example, a most preferred free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Other preferred free radically polymerizable compounds are available from Sartomer Company, Inc. such as SR399 (dipentaerythritol pentaacrylate), SR355 (di-trimethylolpropane tetraacrylate), SR295 (pentaerythritol tetraacrylate), and others that would be readily apparent to one skilled in the art.

Also useful are urea urethane(meth)acrylates and urethane (meth)acrylates described in U.S. Pat. No. 6,582,882 (noted above) and U.S. Pat. No. 6,899,994 (noted above), and in copending and commonly assigned U.S. Ser. No. 11/196,124 (filed Aug. 3, 2005 by Saraiya et al.) that is incorporated by reference.

Numerous other free radically polymerizable compounds are known to those skilled in the art and are described in considerable literature including *Photoreactive Polymers: The Science and Technology of Resists,* A Reiser, Wiley, N.Y., 1989, pp. 102-177, by B. M. Monroe in *Radiation Curing: Science and Technology,* S. P. Pappas, Ed., Plenum, N.Y., 1992, pp. 399-440, and in "Polymer Imaging" by A. B. Cohen and P. Walker, in *Imaging Processes and Material,* J. M. Sturge et al. (Eds.), Van Nostrand Reinhold, New York, 1989, pp. 226-262. For example, useful free radically polymerizable components are also described in EP 1,182,033A1 (noted above), beginning with paragraph [0170].

The free radically polymerizable component is present in the radiation-sensitive composition in an amount sufficient to render the composition insoluble in an aqueous developer after exposure to radiation. This is generally from about 10 to about 70 weight % and preferably from about 20 to about 50 weight % based on the dry weight of the radiation-sensitive composition. For example, the weight ratio of free radically polymerizable component to the polymeric binder (described below) is generally from about 5:95 to about 95:5, preferably from about 10:90 to about 90:10, and more preferably from about 30:70 to about 70:30.

The radiation-sensitive composition includes an initiator composition that is capable of generating radicals sufficient to initiate polymerization of the radically polymerizable component upon exposure to the imaging radiation. The initiator composition may be responsive, for example, to electromagnetic radiation in the ultraviolet, visible and/or infrared spectral regions, corresponding to the broad spectral range of from about 150 nm to about 1500 nm. UV and visible light sensitivity is generally from about 150 nm to about 700 nm. Preferably, the initiator composition is responsive to infrared or near infrared radiation in the range of from about 600 nm to about 1300 nm, and more preferably to infrared radiation in the range of from about 700 nm to about 1200 nm.

There are numerous compounds known in the literature that can be used in this manner including but not limited to, organic boron salts, s-triazines, benzoyl-substituted compounds, onium salts (such as iodonium, sulfonium, diazonium, and phosphonium salts), trihaloalkyl-substituted compounds, metallocenes (such as titanocenes), ketoximes, thio compounds, organic peroxides, or a combination of two or more of these classes of compounds. The organic boron salts, s-triazines, iodonium salts, and hexaarylbisimidazoles, or combinations thereof, are preferred.

Other suitable initiator compositions comprise compounds that include but are not limited to, amines (such as alkanol amines), thiol compounds, anilinodiacetic acids or derivatives thereof, N-phenyl glycine and derivatives thereof, N,N- dialkylaminobenzoic acid esters, N-arylglycines and derivatives thereof (such as N-phenylglycine), aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, alkyltriarylborates, trihalogenomethylarylsulfones, benzoin ethers and esters, peroxides (such as benzoyl peroxide), hydroperoxides (such as cumyl hydroperoxide), azo compounds (such as azo bis-isobutyronitrile) as described for example in U.S. Pat. No. 4,565,769 (Dueber et al.), borate and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts). Other known initiator composition components are described for example in U.S Patent Application Publication 2003/0064318 (Huang et al.).

Particularly useful initiator composition components for UV and visible light sensitive radiation-sensitive compositions include hexaarylbiimidazoles (also known as triarylimidazolyl dimers) such as, for example, 2,2'-bis(2-chlorophenyl)-4,4',5,5'-tetraphenyl-biimidazole and 2,2'-bis(o-chlorophenyl-4,4',5,5'-tetra(m-methoxyphenyl)biimidazole. The triazines noted below can be used with exposure to imaging radiation at about any wavelength including UV and visible radiation exposure.

Other UV radiation-sensitive free-radical generating compounds include but are not limited to, trichloromethyl triazines as described, for example, in U.S. Pat. No. 4,997,745 (Kawamura et al.) and diaryliodonium salts.

Co-initiators can also be used, such as metallocenes (such as titanocenes and ferrocenes), mono- and polycarboxylic acids such as anilino diacetic acid, haloalkyl triazines, thiols or mercaptans (such as mercaptotriazoles), borate salts, and photooxidants containing a heterocyclic nitrogen that is substituted by an alkoxy or acyloxy group, as described in U.S. Pat. No. 5,942,372 (West et al.).

For IR-sensitive radiation-sensitive compositions, the preferred initiator compositions comprise an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N═N$^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, sulfonates, hydroxide, perchlorate, n-butyltriphenyl borate, tetraphenyl borate, and others readily apparent to one skilled in the art.

The halonium salts are more preferred, and the iodonium salts are most preferred. In one preferred embodiment, the onium salt has a positively-charged iodonium, (4-methylphenyl)[4-(2-methylpropyl)phenyl]-moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl)phenyl]iodonium hexafluorophosphate and is supplied in a 75% propylene carbonate solution.

Particularly useful boron components include organic boron salts that include an organic boron anion such as those described in the noted U.S. Pat. No. 6,569,603 that is paired with a suitable cation such as an alkali metal ion, an onium, or a cationic sensitizing dye. Useful onium cations include but are not limited to, ammonium, sulfonium, phosphonium, iodonium, and diazonium cations. Iodonium salts and particularly iodonium borates are particularly useful as initiator compounds in radiation-sensitive compounds that are designed for "on-press" development (described in more detail below). They may be used alone or in combination with various co-initiators such as heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition. The mercaptotriazoles are preferred in these combinations of compounds.

Some initiator compositions include one or more azine compounds as described for example in U.S. Pat. No. 6,936,384 (Munnelly et al.). These compounds are organic heterocyclic compounds containing a 6-membered ring formed from carbon and nitrogen atoms. Azine compounds include heterocyclic groups such as pyridine, diazine, and triazine groups, as well as polycyclic compounds having a pyridine, diazine, or triazine substituent fused to one or more aromatic rings such as carbocyclic aromatic rings. Thus, the azine compounds include, for example, compounds having a quinoline, isoquinoline, benzodiazine, or naphthodiazine substituent. Both monocyclic and polycyclic azine compounds are useful.

Especially useful azine compounds are triazine compounds that include a 6-membered ring containing 3 carbon atoms and 3 nitrogen atoms such as those described in U.S. Pat. No. 6,309,792 (Hauck et al.), U.S. Pat. No. 6,010,824 (Komano et al.), U.S. Pat. No. 5,885,746 (Iwai et al), U.S. Pat. No. 5,496,903 (Watanabe et al.), and U.S. Pat. No. 5,219,709 (Nagasaka et al.).

The azinium form of azine compounds can also be used if desired. In azinium compounds, a quaternizing substituent of a nitrogen atom in the azine ring is capable of being released as a free radical. The alkoxy substituent that quaternizes a ring nitrogen atom of the azinium nucleus can be selected from among a variety of alkoxy substituents.

Halomethyl-substituted triazines, such as trihalomethyl triazines, are particularly useful in the initiator composition. Representative compounds of this type include but are not limited to, 1,3,5-triazine derivatives such as those having 1 to 3-CX$_3$ groups wherein X independently represent chlorine or bromine atoms, including polyhalomethyl-substituted triazines and other triazines, such as 2,4-trichloromethyl-6-methoxyphenyl triazine, 2-phenyl-4,6-bis(trichloromethyl)-s-triazine,2,4,6-tris(trichloromethyl)-s-triazine, 2-methyl-4,6-bis (trichloromethyl)-s-triazine, 2-(styryl-4,6-bis(trichloromethyl)-s-triazine, 2-(p-methoxystyryl)-4,6-bis (trichloromethyl)-s-triazine, 2-(4-methoxy-naphtho-1-yl)-4, 6-bis(trichloromethyl)-s-triazine, 2-(4-ethoxynaphtho-1-yl)-4,6-bis(trichloromethyl)-s-triazine, and 2-(4-(2-ethoxyethyl)-naphtho-1-yl)-4,6-bis(trichloromethyl)-s-triazine], 2-(4-methylthiophenyl)-4,6-bis(trichloromethyl)-2-triazine, 2-(4-chlorophenyl-4,6-bis(trichloromethyl)-2-triazine, 2,4,6-tri(trichloromethyl)-2-triazine, and 2,4,6-tri (tribromomethyl)-2-triazine.

The azine compounds and particularly the triazine compounds may be used alone or in combination with one or more co-initiators such as titanocenes, mono- and polycarboxylic acids, hexaarylbisimidazoles, as described for example in U.S. Pat. No. 4,997,745 (Kawamura et al.) that is incorporated herein by reference.

In some embodiments, the radiation-sensitive composition also includes a mercaptan derivative such as a mercaptotriazole such as 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2, 4-triazole. Various mercaptobenzimidazoles, mercaptobenzothiazoles, and mercaptobenzoxazoles may also be present.

Thus, several initiator/co-initiator combinations can be used in various embodiments of the present invention, namely:

a) a triazine as described above in combination with a co-initiator that is an N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof) as described above, b) a triazine as described above in combination with a co-initiator that is a mercaptan derivative as described above, c) an iodonium salt (such as an iodonium borate) as described above in combination with a co-initiator that is a metallocene (for example a titanocene or ferrocene) as described for example in U.S. Pat. No. 6,936,384 (noted above), and d) an iodonium salt (such as an iodonium borate) as described above in combination with a co-initiator that is a mercaptotriazole as described above.

The initiator compositions most preferably comprise one or more diaryliodonium borate compounds, each of which is represented by the following Structure (II):

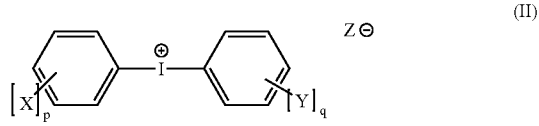

(II)

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono-and poly-, branched and linear haloalkyls), substituted or unsubstituted alkyloxy having 1 to 20 carbon atoms (for example, substituted or unsubstituted methoxy, ethoxy, iso-propoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Preferably, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated by this invention but the "symmetric" compounds are preferred (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but preferably they are at the 2- or 4-positions, and more preferably at the 4-position, on either or both phenyl rings.

Despite what type of X and Y groups are present in the iodonium cation, the sum of the carbon atoms in the X and Y substituents is from about 6, and preferably from about 8, to about 40. Thus, in some compounds, one or more X groups can comprise from about 6 carbon atoms, and Y does not exist (q is 0). Alternatively, one or more Y groups can comprise from about 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is from about 6. Still again, there may be a total of from about 6 carbon atoms on both phenyl rings.

In Structure II, p and q are independently 0 or integers of 1 to 5, provided that either p or q is from about 1. Preferably, both p and q are from about 1, and more preferably, each of p and q is 1. Thus, it is understood that the carbon atoms in the phenyl rings that are not substituted by X or Y groups have a hydrogen atom at those ring positions.

$Z^-$ is an organic borate anion represented by the following Structure (III):

(III)

wherein $R_1$, $R_2$, $R_3$, and $R_4$ are independently substituted or unsubstituted alkyl groups having 1 to 12 carbon atoms (such as methyl, ethyl, n-propyl, iso-propyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms.

Preferably, $R_1$, $R_2$, $R_3$, and $R_4$ are independently substituted or unsubstituted alkyl or aryl groups as defined above, and more preferably, at least 3 of $R_1$, $R_2$, $R_3$, and $R_4$ are the same or different substituted or unsubstituted aryl groups (such as substituted or unsubstituted phenyl groups). Most preferably, all of $R_1$, $R_2$, $R_3$, and $R_4$ are the same or different substituted or unsubstituted aryl groups and most preferably, all of the groups are the same substituted or unsubstituted phenyl group. Preferably, $Z^-$ is a tetraphenyl borate wherein the phenyl groups are substituted or unsubstituted (and most preferably, all are unsubstituted).

Representative iodonium borate compounds useful in this invention include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis(pentafluorophenyl)borate, 4-methylphenyl-4'-dodecylphenyliodonium tetrakis(4-fluorophenyl)borate, bis(dodecylphenyl)iodonium tetrakis(pentafluorophenyl)borate, and bis(4-t-butylphenyl)iodonium tetrakis(1-imidazolyl)borate. Preferred compounds include bis(4-t-butylphenyl)iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition.

The diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry*, 37, 4241-4254 (1999).

The initiator composition including one or more initiator compounds is generally present in the radiation-sensitive composition in an amount of from about 0.5% to about 30%, based on the total solids of the radiation-sensitive composition or the dry weight of the coated imageable layer. Preferably, the initiator composition is present in an amount of from about 2% to about 20 weight %. In the preferred embodiments, one or more diaryliodonium borate compounds generally comprise from about 10 to about 100% of the initiator composition. In the coated imageable layers of the imageable elements, the preferred diaryliodonium borate compounds are generally present in an amount of from about 0.01 g/m$^2$ and preferably from about 0.03 to about 0.3 g/m$^2$.

The radiation-sensitive composition also includes particles of a poly(urethane-acrylic) hybrid that are distributed (usually uniformly) throughout the composition. This hybrid has a molecular weight of from about 50,000 to about 500,000 and the particles have an average particle size of from about 10 to about 10,000 nm (preferably from about 30 to about 500 nm and more preferably from about 30 to about 150 nm). These hybrids can be either "aromatic" or "aliphatic" in nature depending upon the specific reactants used in their manufacture. Blends of particles of two or more poly(urethane-acrylic) hybrids can also be used. For example, a blend of Hybridur® 570 polymer dispersion with Hybridur® 870 polymer dispersion could be used.

It is also desirable that the poly(urethane-acrylic) hybrid particles remain insoluble in the following test:

0.1 g of particles are shaken for 24 hours at 20° C. in 10 g (1%) in an 80% aqueous solution (20% water) of either 2-butoxyethanol or 4-hydroxy-4-methyl-2-pentanone.

In general, the poly(urethane-acrylic) hybrids can be prepared by reacting an excess of diisocyanate with a polyol, dispersing the resulting polyurethane prepolymer in water. Preferably, the prepolymer contains carboxy groups. The prepolymers are then mixed with one or more vinyl monomers such as acrylates or styrene or substituted styrene monomers. Tertiary amines are added to the mixtures and they are dispersed in water, and oil-soluble initiators are added to begin polymerization. The resulting polymer hybrids are dispersed as colloidal particles. This dispersion is not merely a mixture or blend of a polyurethane dispersion and an acrylic emulsion. The urethane and acrylic polymerizations are completed concurrently. Preferably, the acrylic-urethane hybrid dispersion is anionically stabilized. It may also be free of N-methylpyrrolidone.

One specific synthetic method includes preparing a polyurethane dispersion, adding acrylic monomers and forming the acrylic polymer in the presence of the polyurethane dispersion, as described for example in U.S. Pat. No. 3,684,758 (Honig et al.) that is incorporated herein for its synthetic methods.

Another specific method includes dispersing the urethane prepolymer and acrylic monomers together in water and completing the urethane and acrylic polymerizations concurrently as described for example in U.S. Pat. No. 4,644,030 (Loewrigkeit et al.) and U.S. Pat. No. 5,173,526 (Vijayendran et al.) both of which are incorporated herein by reference for their synthetic methods.

Other details about manufacturing methods and properties of the poly(urethane-acrylic) hybrids are provided by Galgoci et al. in *JCT Coatings Tech.* 2(13), 28-36 (February 2005).

Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that may also include commercial surfactants, anti-foaming agents, dispersing agents, anti-corrosive agents, and optionally pigments and water-miscible organic solvents. Further details about each commercial Hybridur® polymer dispersion can be obtained by visiting the Air Products and Chemicals, Inc. website.

The poly(urethane-acrylic) hybrid is present in the radiation-sensitive composition in an amount of from about 10 to about 70 weight % and preferably from about 10 to about 50 weight %, based on total composition dry weight, or dry imageable layer weight.

Additional polymeric binders may also be used in the radiation-sensitive composition in addition to the poly(urethane-acrylic) hybrids described above. Such polymeric binders can be any of those known in the art for use in negative-working radiation-sensitive compositions. These polymeric binders generally have a molecular weight of from about 2,000 to about 1,000,000 and preferably from about 10,000 to about 200,000. The acid value (mg KOH/g) of the polymeric binder is generally from about 20 to about 400 as determined using known methods. Such polymeric binders can be particulate or film-forming in nature.

Examples of polymeric binders include but are not limited to, those derived at least in part from one or more monomers having pendant carboxyl groups such as (meth)acrylic acids, (meth)acrylates, (meth)acrylamides, (meth)acrylonitriles, poly(alkylene glycols), poly(alkylene glycol)(meth)acrylates, vinyl acetals, styrene and substituted styrenes, N-substituted cyclic imides or maleic anhydrides, such as those described in EP 1,182,033 (noted above) and U.S. Pat. No. 6,309,792 (noted above), U.S. Pat. No. 6,352,812 (Shimazu et al.), U.S. Pat. No. 6,569,603 (noted above), and U.S. Pat. No. 6,893,797 (noted above). Phenolic resins are also used. Also useful are the vinyl carbazole polymers having pendant N-carbazole moieties including those described in U.S. Pat. No. 4,774,163 (Higashi) and polymers having pendant vinyl groups including those described in U.S. Pat. No. 6,899,994 (Huang et al.) and U.S. Pat. No. 4,511,645 (Koike et al.), and EP 1,182,033A1 (Fujimaki et al.).

In particular, polymers derived from one or more monomers with pendant carboxy groups, (meth)acrylates, styrene and styrene derivatives, vinyl acetal, N-substituted cyclic imides, maleic anhydride, vinyl carbazoles, monomers with multiple vinyl groups, (meth)acrylonitriles, (meth)acrylamides, poly(alkylene glycols), poly(alkylene glycol) (meth)acrylates, and N-substituted (meth)acrylamides are particularly useful as polymeric binders.

Other useful additional polymeric binders are dispersible, developable, or soluble in water or water/solvent mixtures such as fountain solutions. Such polymeric binders include polymeric emulsions, dispersions, or graft polymers having pendant poly(alkyleneoxide) side chains that can render the imageable elements as "on-press" developable. Such polymeric binders are described for example in U.S. Pat. Nos. 6,582,882 and 6,899,994 (both noted above). In some instances, these additional polymeric binders are present in the imageable layer as discrete particles.

Other useful additional polymeric binders have hydrophobic backbones and comprise both of the following a) and b) recurring units, or the b) recurring units alone:

a) recurring units having pendant cyano groups attached directly to the hydrophobic backbone, and b) recurring units having pendant groups comprising poly(alkylene oxide) segments.

These additional polymeric binders comprise poly(alkylene oxide) segments and preferably poly(ethylene oxide) segments. These polymers can be graft copolymers having a main chain polymer and poly(alkylene oxide) pendant side chains or segments or block copolymers having blocks of (alkylene oxide)-containing recurring units and non(alkylene oxide)-containing recurring units. Both graft and block copolymers can additionally have pendant cyano groups attached directly to the hydrophobic backbone. The alkylene oxide constitutional units are generally $C_1$ to $C_6$ alkylene oxide groups, and more typically $C_1$ to $C_3$ alkylene oxide groups. The alkylene portions can be linear or branched or substituted versions thereof. Poly(ethylene oxide) and poly(propylene oxide) segments are preferred and poly(ethylene oxide) segments are most preferred.

In some embodiments, the additional polymeric binders contain only recurring units comprising poly(alkylene oxide) segments, but in other embodiments, the additional polymeric binders comprise recurring units comprising the poly(alkylene oxide) segments as well as recurring units having pendant cyano groups attached directly to the hydrophobic backbone. By way of example only, such recurring units can comprise pendant groups comprising cyano, cyano-substituted alkylene groups, or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. Patent Application Publication 2005/003285 (Hayashi et al.).

By way of example, such additional polymeric binders can be formed by polymerization of a combination or mixture of suitable ethylenically unsaturated polymerizable monomers or macromers, such as:

A) acrylonitrile, methacrylonitrile, or a combination thereof,

B) poly(alkylene oxide) esters of acrylic acid or methacrylic acid, such as poly(ethylene glycol) methyl ether acrylate, poly(ethylene glycol) methyl ether methacrylate, or a combination thereof, and C) optionally, monomers such as acrylic acid, methacrylic acid, styrene, hydroxystyrene, acrylate esters, methacrylate esters, acrylamide, methacrylamide, or a combination of such monomers.

The amount of the poly(alkylene oxide) segments in such additional polymeric binders is from about 0.5 to about 60 weight %, preferably from about 2 to about 50 weight %, more preferably from about 5 to about 40 weight %, and most preferably from about 5 to about 20 weight %. The amount of (alkylene oxide) segments in the block copolymers is generally from about 5 to about 60 weight %, preferably from about 10 to about 50 weight %, and more preferably from about 10 to about 30 weight %. It is also possible that the polymeric binders having poly(alkylene oxide) side chains are present in the form of discrete particles.

Still other polymeric binders are represented by the following Structure (I):

$$-(A)_x-(B)_y-(C)_z- \quad (I)$$

wherein A represents recurring units comprising a pendant —C(=O)O—CH$_2$CH=CH$_2$ group, B represents recurring units comprising pendant cyano groups, and C represents recurring units other than those represented by A and B and optionally including recurring units having pendant carboxy groups (for example, recurring units in which the carboxy groups are not converted to —C(=O)O—CH$_2$CH=CH$_2$ groups as described below).

Preferably, B represents recurring units derived from (meth)acrylonitrile, and C represents recurring units derived from one or more (meth)acrylic acid esters, (meth)acrylamides, vinyl carbazole, styrene and styrenic derivatives thereof, N-substituted maleimides, (meth)acrylic acid, maleic anhydride, vinyl acetate, vinyl ketones (such as vinyl methyl ketone), vinyl pyridines, N-vinyl pyrrolidones, 1-vinylimidazole, and vinyl polyalkylsilanes (such as vinyl trimethylsilane). Most preferably, B represents recurring units derived from acrylonitrile, and C is derived from one or more of methacrylic acid, acrylic acid, vinyl carbazole, methyl methacrylate, 2-hydroxyethyl methacrylate, styrene, and N-phenylmaleimide.

The polymeric binders represented by Structure (I) are generally present in the radiation-sensitive composition (and imageable layer) in an amount of from about 10 to about 70 weight %, based on the total composition or layer solids. Preferably, the amount is from about 20 to about 50 weight %.

The polymeric binders of Structure (I) generally have a molecular weight of from about 2,000 to about 1,000,000 and preferably from about 10,000 to about 200,000. The acid value (mg KOH/g) of the polymeric binder is generally from about 20 to about 400 as determined using known methods.

The additional polymeric binders described above can be present in an amount of from about 1.5 to about 75%, and preferably from about 1.5 to about 40%, based on the total solids content of the radiation-sensitive composition or the dry weight of the imageable layer prepared there from.

The radiation-sensitive compositions also include a radiation absorbing compound (sometimes called a "sensitizer") that is sensitive to radiation at a desired wavelength. These compounds absorb the radiation and facilitate polymerization during imaging. The radiation absorbing compounds can be sensitive to radiation having a wavelength of from about 150 to about 1400 nm. The compounds sensitive to UV and visible radiation generally have a $\lambda_{max}$ of from about 150 to about 600 nm, and preferably of from about 200 to about 550 nm.

In some preferred embodiments, the radiation-sensitive composition contains a UV sensitizer where the free-radical generating compound is UV radiation sensitive (that is at least 250 nm and up to and including 450 nm), thereby facilitating photopolymerization. Typical UV radiation-sensitive free-radical generating compounds are described above. In some preferred embodiments, the radiation sensitive compositions are sensitized to "violet" radiation in the range of at least 375 nm and up to and including 450 nm. Useful sensitizers for such compositions include certain pyrilium and thiopyrilium dyes and 3-ketocoumarins (particularly in combination with a polycarboxylic acid free radical generating compound, such as anilino-N,N-diacetic acid).

Sensitizers that absorb in the visible region of the electromagnetic spectrum (that is at least 400 nm and up to and including 650 nm) can also be used. Examples of such sensitizers are well known in the art and include the compounds described in Cols. 17-22 of U.S. Pat. No. 6,569,603 (noted above) that is incorporated herein by reference. Other useful visible and UV-sensitive sensitizing compositions include a cyanine dye, diaryliodonium salt, and a co-initiator (as described above) as described in U.S. Pat. No. 5,368,990 (Kawabata et al.).

Other useful sensitizers for the violet/visible region of sensitization are the 2,4,5-triaryloxazole derivatives as described in WO 2004/074930 (Baumann et al.) that is incorporated herein by reference. These compounds can be used alone or with a co-initiator as described above, and especially with the 1,3,5-triazines described above or with thiol compounds. Useful 2,4,5-triaryloxazole derivatives can be represented by the Structure G-$(Ar_1)_3$ wherein $Ar_1$ is the same or different, substituted or unsubstituted carbocyclic aryl group having 6 to 12 carbon atoms in the ring, and G is a furan, oxazole, or oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through $R'_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —$N(R'_4)(R'_5)$ group, or a —$OR'_6$ group wherein $R'_4$ through $R'_6$ independently represent substituted or unsubstituted alkyl or aryl groups as defined above. Preferably, at least one of $R'_1$ through $R'_3$ is an —$N(R'_4)(R'_5)$ group wherein $R'_4$ and $R'_5$ are the same or different alkyl groups. Preferred substituents for each $Ar_1$ group include the same or different primary, secondary, and tertiary amines and more preferably they are the same dialkylamines.

Still another class of useful violet/visible radiation sensitizers includes compounds represented by the Structure $Ar_1$-G-$Ar_2$ wherein $Ar_1$ and $Ar_2$ are the same or different substituted or unsubstituted aryl groups having 6 to 12 carbon atoms in the ring, or $Ar_2$ can be an arylene-G-$Ar_1$ or arylene-G-$Ar_2$ group, and G is a furan, ozazole, or oxadiazole ring. $Ar_1$ is the same as defined above, and $Ar_2$ can be the same or different aryl group as $Ar_1$. "Arylene" can be any of the aryl groups defined for $Ar_1$ but with a hydrogen atom removed to render them divalent in nature.

Additional useful "violet"-visible radiation sensitizers are the compounds described in WO 2004/074929 (Baumann et al.) that is also incorporated herein by reference. These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

Preferably, the radiation absorbing compounds are sensitive to infrared and near-infrared radiation, that is, a wavelength of from about 600 to about 1400 nm and preferably of from about 700 to about 1200 nm. Such radiation absorbing compounds include carbon blacks and other IR-absorbing pigments and various IR-sensitive dyes ("IR dyes"), which are preferred.

Examples of suitable IR dyes include but are not limited to, azo dyes, squarilium dyes, croconate dyes, triarylamine dyes, thiazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135

(Patel et al.), U.S. Pat. No. 6,569,603 (noted above), and U.S. Pat. No. 6,787,281 (noted above), and EP Publication 1,182, 033A1 (noted above).

A general description of one class of suitable cyanine dyes is shown by the formula in paragraph [0026] of WO 2004/ 101280. In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pats. No. 6,309,792 (Hauck et al.), U.S. Pat. No. 6,264,920 (Achilefu et al.), U.S. Pat. No. 6,153,356 (Urano et al.), and U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S Pat. No. 4,973,572 (DeBoer).

Useful IR absorbing compounds include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

The radiation absorbing compound can be present in the radiation-sensitive composition in an amount generally of from about % to about 30% and preferably from about 2 to about 15%, based on total solids in the composition that also corresponds to the total dry weight of the imageable layer. Alternatively, the amount can be defined by an absorbance in the range of from about 0.05 to about 3, and preferably of from about 0.1 to about 1.5, in the dry film as measured by reflectance UV-visible spectrophotometry. The particular amount needed for this purpose would be readily apparent to one skilled in the art, depending upon the specific compound used.

The radiation-sensitive composition can also include a poly(alkylene glycol) or an ether or ester thereof that has a molecular weight of from about 200 to about 4000 (preferably from about 500 to about 2000). This additive can be present in an amount of from about 2 to about 50 weight % (preferably from about 5 to about 30%) based on the total solids content of the composition, or the total dry weight of the imageable layer. Particularly useful additives of this type include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are SR9036 (ethoxylated (30) bisphenol A dimethacrylate), CD9038 (ethoxylated (30) bisphenol A diacrylate), and SR494 (ethoxylated (5) pentaerythritol tetraacrylate), and similar compounds all of which that can be obtained from Sartomer Company, Inc.

The radiation-sensitive composition can also include a poly(vinyl alcohol), a poly(vinyl pyrrolidone), poly(vinyl imidazole), or polyester in an amount of up to 20 weight % based on the total solids content of the composition, or the total dry weight of the imageable layer.

The radiation-sensitive composition can also include a variety of optional compounds including but not limited to, dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

In some embodiments, the radiation-sensitive composition also includes a mercaptan derivative such as a mercaptotriazole such as 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl- 1,2,4-triazole, and 5-(p-aminophenyl)-3-mercapto-1,2, 4-triazole. Various mercaptobenzimidazoles, mercaptobenzthiazoles, and mercaptobenzoxazoles may also be present.

Imageable Elements

The imageable elements are formed by suitable application of a radiation-sensitive composition as described above to a suitable substrate to form an imageable layer. This substrate can be treated or coated in various ways as described below prior to application of the radiation-sensitive composition. Preferably, there is only a single imageable layer comprising the radiation-sensitive composition of this invention. If the substrate has been treated to provide an "interlayer" for improved adhesion or hydrophilicity, the applied radiation-sensitive composition is generally considered the "top" or outermost layer. These interlayers, however, are not considered "imageable layers". While there is usually no need to apply what is conventionally known as an overcoat (such as an oxygen impermeable topcoat) to the imageable layer(s) as described in WO 99/06890 (Pappas et al.), it can be used if desired. Such overcoat layers or topcoats can comprise one or more water-soluble polymers such as poly(vinyl alcohol), poly(vinyl pyrrolidone), and poly(vinyl imidazole) and generally are present at a dry coating weight of from about 0.1 to about 4 $g/m^2$.

The substrate generally has a hydrophilic surface, or from about a surface that is more hydrophilic than the applied radiation-sensitive composition on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both flat surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing. Preferably, the aluminum sheet is electrochemically anodized using phosphoric acid or sulfuric acid and conventional procedures.

An interlayer maybe formed by treatment of the aluminum support with, for example, a silicate, dextrine, calcium zirconium fluoride, hexafluorosilicic acid, a phosphate solution containing a fluoride such as sodium fluoride (PF), poly(vinyl phosnhonic acid) (PVPA), vinyl phosphonic acid copolymer, poly(acrylic acid), or acrylic acid copolymer. Preferably, the aluminum support is grained, phosphoric acid-anodized, and treated with poly(acrylic acid) using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaging cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Preferably, the radiation-sensitive composition is applied as the outermost layer.

Illustrative of such manufacturing methods is mixing the radically polymerizable component, initiator composition, radiation absorbing compound, polymeric binder(s), and any other components of the radiation-sensitive composition in a suitable organic solvent [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Preferred coating solvents and representative imageable layer formulations are described in the Examples below. After proper drying, the coating weight of the imageable layer is generally from about 0.1 to about 5 $g/m^2$, preferably from about 0.5 to about 3.5 $g/m^2$, and more preferably from about 0.5 to about 2 $g/m^2$.

Layers can also be present under the imageable layer to enhance developability or to act as a thermal insulating layer. The underlying layer should be soluble or from about dispersible in the developer and preferably have a relatively low thermal conductivity coefficient.

The imageable elements have any useful form including but not limited to, printing plate precursors, printing cylinders, printing sleeves and printing tapes (including flexible printing webs). Preferably, the imageable members are printing plate precursors that can be of any useful size and shape (for example, square or rectangular) having the requisite imageable layer disposed on a suitable substrate. Printing cylinders and sleeves are known as rotary printing members having the substrate and imageable layer in a cylindrical form. Hollow or solid metal cores can be used as substrates for printing sleeves.

Imaging Conditions

During use, the imageable element is exposed to a suitable source of radiation such as UV, visible light, near-infrared, or infrared radiation, depending upon the radiation absorbing compound present in the radiation-sensitive composition, at a wavelength of from about 150 nm to about 1500 nm. Preferably, imaging is carried out using an infrared laser at a wavelength of from about 700 nm to about 1200 nm. The laser used to expose the imageable element is preferably a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1060 to about 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Creo Trendsetter® imagesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio). "Violet" imaging can be carried out using such equipment as a Fuji Luxel Vx-9600 platesetter.

Infrared imaging can be carried out generally at an imaging energy of from about 20 $mJ/cm^2$ to about 500 $mJ/cm^2$, preferably from about 50 and up to 300 $mJ/cm^2$.

Imaging radiation in the UV to visible region of the spectrum, and particularly the UV region (for example at least 250 nm and up to and including 450 nm), can be carried out generally using energies of at least 0.01 $mJ/cm^2$ and up to and including 0.5 $mJ/cm^2$, and preferably at least 0.02 and up to and including about 0.1 $mJ/cm^2$. It would be desirable, for example, to image the UV/visible radiation-sensitive imageable elements at a power density in the range of at least 0.5 and up to and including 50 $kW/CM^2$ and preferably of at least 5 and up to and including 30 $kW/cm^2$. Such imaging could be carried out on-press, or the subsequent development could be carried out on-press.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

Without the need for a pre-heat step after imaging, the imaged elements can be developed "off-press" using conventional processing and a conventional developer such as an organic solvent-based developer. Development can be accomplished using what is known as "manual" development, "dip" development, or processing with an automatic development apparatus (processor).

In the case of "manual" development, development is conducted by rubbing the entire imaged element with a sponge or cotton pad sufficiently impregnated with a suitable developer (described below), and followed by rinsing with water. "Dip" development involves dipping the imaged element in a tank or tray containing the appropriate developer for about 10 to about 60 seconds (especially from about 20 to about 40 seconds) under agitation, followed by rinsing with water with or without rubbing with a sponge or cotton pad. The use of automatic development apparatus is well known and generally includes pumping a developer into a developing tank or ejecting it from spray nozzles. The imaged element is contacted with the developer in an appropriate manner. The apparatus may also include a suitable rubbing mechanism (for example a brush or roller) and a suitable number of conveyance rollers. Some developing apparatus include laser exposure means and the apparatus is divided into an imaging section and a developing section.

Developers commonly include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates). The pH of the developer is generally from about 6 to about 14. The imaged elements are generally developed using conventional processing conditions. Both aqueous alkaline developers and organic solvent-based developers can be used with the latter type of developers being preferred.

Useful alkaline aqueous developers include 3000 Developer, 9000 Developer, GOLDSTAR Developer, GREENSTAR Developer, ThermalPro Developer, PROTHERM Developer, MX1813 Developer, and MX1710 Developer (all available from Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Organic solvent-based developers are generally single-phase solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 and up to 15% based on total developer weight. The organic solvent-based developers can be neutral, alkaline, or slightly acidic in pH, and preferably, they are alkaline in pH.

Representative solvent-based developers include ND-1 Developer, Developer 980, 2 in 1 Developer, 955 Developer, D29 Developer (described below), and 956 Developer (all available from Eastman Kodak Company).

Generally, the developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals.

Following this off-press development, the imaged element can be rinsed with water and dried in a suitable fashion. The dried element can also be treated with a conventional gumming solution (preferably gum arabic), with or without additional water. In addition, a postbake operation can be carried out, with or without a blanket exposure to UV or visible radiation. Alternatively, a post-UV floodwise exposure (without heat) can be used to enhance the performance of the imaged element.

Alternatively, the imaged element can be developed using a developer solution that consists essentially of water (preferably warm water) and optionally containing an alcohol or alcohol-replacement additive where water makes up the predominant portion of the developer solution. This simplified developer may also include a surfactant. Development using essentially water may be facilitated with modest rubbing using a cloth, sponge, or brush.

Using a heated developer may facilitate development in some embodiments. For example, the developer solution consisting essentially of water can be heated and used at a temperature greater than 30° C. and preferably greater than 35° C. Such development can be carried out using the commercial Aquascrubber 34 plate processor that is available from Precision Lithograining (South Hadley, Mass.).

In other embodiments, development can be accomplished by contacting the imaged element with a commercial plate cleaner such as Prisco LPC (available from Printer's Service, Newark, N.J.). Development with such solutions may also be facilitated using modest rubbing with a cloth, sponge, or brush. In addition, this development can be carried out on-press where the imageable element is either developed, or both imaged and developed on-press.

Following development with essentially water or the plate cleaner, the imaged element can be rinsed with water and dried in a suitable fashion. The dried element can also be treated with a conventional gumming solution (preferably gum arabic), with or without additional water. In addition, a postbake operation can be carried out, with or without a blanket exposure to UV or visible radiation.

Printing can be carried out by applying a lithographic ink and fountain solution to the printing surface of the imaged and developed element. The fountain solution is taken up by the non-exposed regions, that is, the surface of the hydrophilic substrate revealed by the imaging and development steps, and ink is taken up by the imaged (exposed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

Some imageable elements of this invention may be developable "on-press". This type of development avoids the use of the developing solutions described above and the use of a separate development apparatus. The imaged element is directly mounted onto the press wherein the non-exposed regions in the imageable layer are removed by a suitable fountain solution, lithographic ink, or both, in any order, during printing. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+ Varn PAR (alcohol sub) (available from Varn International, Addison, Ill.). Alternatively, the imageable element can be both imaged and developed on-press.

The following examples are provided to illustrate the practice of the invention but are by no means intended to limit the invention in any manner.

EXAMPLES

The components and materials used in the examples and analytical methods used in evaluation were as follows. Unless otherwise indicated, the components can be obtained from Aldrich Chemical Company (Milwaukee, Wis.):

ADAA represents anilino diacetic acid.

Aqua-image cleaner/preserver was obtained from Eastman Kodak Company (Rochester, N.Y.).

BLO represents γ-butyrolactone.

Byk® 307 is a polyethoxylated dimethyl polysiloxane copolymer that was obtained from Byk Chemie (Wallingford, Conn.) in a 25 wt. % xylene/methoxypropyl acetate solution.

Copolymer 1 is a 10/90 weight percent copolymer of acrylic acid and methyl methacrylate.

Copolymer 2 is a 37/48/10/5 weight percent copolymer of N-4-carboxyphenylmethacrylamide, acrylonitrile, methacrylamide, and N-phenylmaleimide.

Copolymer 3 is a 10/45/30/15 weight percent copolymer of poly(ethylene glycol)methyl ether methacrylate ($M_n$~1,100), acrylonitrile, N-isopropylacrylamide and methacrylic acid.

Crystal violet is a triarylmethane dye that was obtained from Spectrum Chemical (Gardena, Calif.).

D29 is a developer composed of 10.7% of Zacsil® 865, 18.2% Naxan® DIL, 0.9% Petro BA, 0.4% Dowanol EPh, 4.0% benzyl alcohol, and 65.8% water.

Dowanol EPh represents propylene glycol methyl ether.

Elvanol® 5105 is a poly(vinyl alcohol) that was obtained from Dupont (Wilmington, Del.).

Zonyl® FSN-100 is a non-ionic fluorosurfactant that was obtained from Dupont (Mississauga, Ontario, CA).

Graft Copolymer 2 was prepared as shown below.

HB-NK Ester BPE 500 is an ethoxylated Bisphenol A dimethacrylate available from NK-Esters (Japan).

Hybridur® 580 is a urethane-acrylic hybrid polymer dispersion (40%) that was obtained from Air Products and Chemicals, Inc. (Allentown, Pa.).

Hybridur® 870 is a urethane-acrylic hybrid polymer dispersion, 40% that was obtained from Air Products and Chemicals.

IB01 represents 4-methylphenyl-4'-isobutylphenyl iodonium tetraphenylborate.

IB05 represents bis(4-t-butylphenyl)iodonium tetraphenylborate.

IPA represents iso-propyl alcohol.

IRT is an IR Dye that was obtained from Showa Denko (Japan).

66e represents the IR dye shown as follows that was obtained from FEW Chemicals GmbH (Germany).

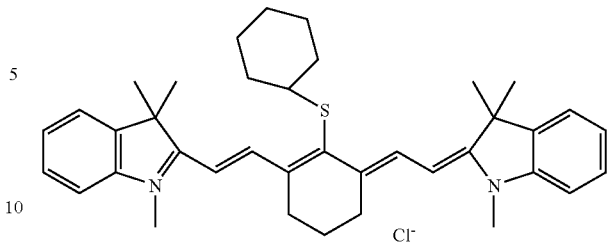

Kayamer PM-2 is a mixed phosphate of 2-hydroxyethyl methacrylate that was obtained from Nippon Kayaku (Japan).

Masurf® FS-1520 is a fluoroaliphatic betaine fluorosurfactant that was obtained from Mason Chemical Company (Arlington Heights, Ill.).

MEK represents methyl ethyl ketone.

N-BAMAAm represents benzoic acid methacrylamide or carboxyphenyl methacrylamide.

Naxan® DIL is a solution of sodium diisopropylnaphthalene sulfonate (35% in water) that was obtained from Rutgers Organic (State College, Pa.).

NK Ester A-DPH is a dipentaerythritol hexaacrylate that was obtained from Kowa American (New York, N.Y.).

Oligomer 1 is a 30% by weight solution in ethyl acetate of a urethane acrylate prepared by reacting 2 parts of hexamethylene diisocyanate, 2 parts of hydroxyethyl methacrylate and 1 part of 2-(2-hydroxyethyl)piperidine.

Petro BA is sodium alkyl naphthalene sulfonate that was obtained from Akzo Nobel (Houston, Tex.).

PGME represents 1-methoxy-2-propanol and it is also known as Dowanol PM.

Phosmer PE is an ethylene glycol methacrylate phosphate with 4-5 ethoxy groups that was obtained from Uni-Chemical Co. Ltd. (Japan).

Pigment A (951) is a 27% solids dispersion of 7.7 parts of a polyvinyl acetal derived from poly(vinyl alcohol) acetalized with acetaldehyde, butyraldehyde, and 4-formylbenzoic acid, 76.9 parts of Irgalith Blue GLVO (Cu-phthalocyanine C.I. Pigment Blue 15:4) and 15.4 parts of Disperbyk® 167 dispersant (Byk Chemie) in 1-methoxy-2-propanol.

Polymer A was prepared as described below.

Polymer B is the polymer described in Col. 15 of U.S. Pat. No. 6,969,570 (Kitson).

Polymer C is Polymer 10 described in paragraph [0130] of U.S. Patent Application Publication 2005/0003285 (noted above).

Prisco LPC is a liquid plate cleaner that was obtained from Printer's Service (Newark, N.J.).

SR-349 is an ethoxylated Bisphenol A diacrylate available from Sartomer Company, Inc. (Exton, Pa.).

SR399 is dipentaerythritol pentaacrylate that was obtained from Sartomer Company, Inc.

Triazine A was obtained from PCAS (Paris, France).

Urethane-acrylic intermediate A is a reaction product of p-toluene sulfonyl isocyanate and hydroxyethyl methacrylate.

UV plate cleaner was obtained from Allied Pressroom Chemistry, Inc. (Hollywood, Fla.).

Varn Litho Etch 142W fountain solution was obtained from Varn International (Addison, Ill.).

Varn-120 plate cleaner was obtained from Varn International.

Varn PAR alcohol replacement was obtained from Varn International.

Vazo-64 is 2,2'-azobis(isobutyronitrile) (AIBN) that was obtained from Dupont de Nemours Co. (Wilmington, Del.).

Zacsil® 865 solution contained potassium silicate (38.5% in water) and was obtained from Zaclon Inc. (Cleveland, Ohio).

The "DH Test" used in the examples was a dry-heat accelerated aging test carried out at 48° C. for 5 days.

The "RH Test" was a high humidity accelerated aging test carried out at 38° C. and a relative humidity of 85% for 5 days.

Preparation of Graft Copolymer 2:

Dimethylacetamide (100.7 g) and PEGMA (20 g in 50% water)) were charged to a 500 ml 4-neck ground glass flask, equipped with a heating mantle, temperature controller, mechanical stirrer, condenser, pressure equalized addition funnel, and nitrogen inlet. The reaction mixture was heated to 80° C. under nitrogen atmosphere. A pre-mixture of dimethylacetamide (125 g), vinyl carbazole (25 g), acrylonitrile (35 g), styrene (20 g), methacrylic acid (10 g), and AIBN (0.5 g, Vazo-64) were added over two hours at 80° C. Reaction was continued another fifteen hours and 1.25 g of Vazo-64 were added in increments. Graft Copolymer 2 conversion was >99% based on determination of the percent of non-volatiles. The weight ratio of PEGMA/acrylonitrile/vinyl carbazole/styrene/methacrylic acid was 10/35/25/20/10 in DMAC at 30% non-volatiles.

The resin solution was precipitated in powder form using mixture of 6000 g of water/ice (3:1) using a Lab Dispersator (4000 RPM) and then it was filtered. The resulting powder was dried at room temperature for 24 hours and 43° C. for two days. The yield was 95% and acid number was 69 mg KOH/g (compared to theoretical of 65). Its structure is shown as follows:

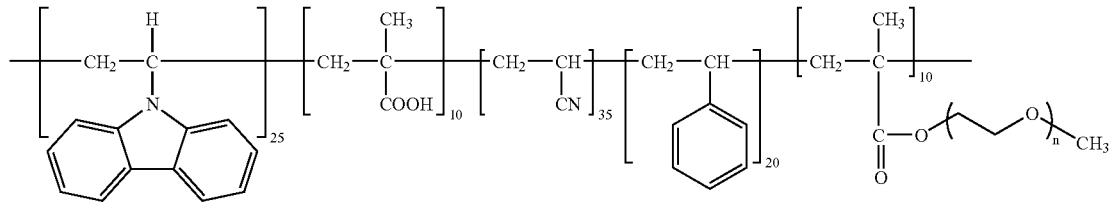

wherein n=40-50.

Synthesis of Polymer A:

Dimethylacetamide (65 g), N-BAMAAm (6.5 g), acrylonitrile (8.4 g), methacrylamide (1.7 g), N-phenyl maleimide (0.9 g), and Vazo-64 (0.175 g) were added to a 500 ml 4-neck ground glass flask, equipped with a heating mantle, temperature controller, mechanical stirrer, condenser, pressure equalized addition funnel and nitrogen inlet. The reaction mixture was heated to 80° C. under a nitrogen atmosphere. Then a pre-mixture of dimethylacetamide (100 g), N-BAMAAm (19.4 g), acrylonitrile (25.2 g), methacrylamide (5.3 g), N-phenyl maleimide (2.6 g), and Vazo-64 (0.35 g) were added over two hours at 80° C. The reaction was continued another eight hours and Vazo 64 (0.35 g) was added two more times. The polymer conversion was >99% based on a determination of percent of non-volatiles. The weight ratio of the resulting N-BAMAAm/-AN/methacrylamide/N-phenyl maleimide polymer was 37:48:10:5. The viscosity (G.H'33) was G+ (~170 cps) at 30% non-volatiles in DMAC.

The resin solution was precipitated in powder form using ethanol/water (60:40) using Lab Dispersator (4000 RPM) and filtered, and the slurry was re-dissolved in ethanol and filtered. The resulting powder was dried at room temperature for 48 hours. The resulting yield was 85% and the polymer acid number was 94.4 (actual) versus 95 (theoretical).

Synthesis of Polymer X:

Dimethylacetamide (65 g), carboxy phenyl methacrylamide (5.4 g), acrylonitrile (8.6 g), n-phenyl maleimide (1.75 g), methacrylic acid (1.75 g), and Vazo-64 (0.175 g) were added to a 500 ml 4-neck ground glass flask, equipped with a heating mantle, temperature controller, mechanical stirrer, condenser, pressure equalized addition funnel and nitrogen inlet. The reaction mixture was heated to 80° C. under nitrogen atmosphere. Then pre-mixture of dimethylacetamide (100 g), carboxy phenyl methacrylate (17 g), acrylonitrile (25 g), n-phenyl maleimide (5.25 g), methacrylic acid (5.25 g), and Vazo-64 (0.35 g) were added over two hours at 80° C. The reaction was continued another ten hours during which Vazo-64 (0.35g) was added two more times. The polymer conversion was >98% based on a determination of percent of non-volatiles. The weight ratio of the polymer of carboxy phenyl methacrylamide/acrylonitrile/phenyl maleimide/methacrylic acid was 32/48/10/10. The resin solution was precipitated in powder form in 6000 g of mixture of water/ice (3:1) using a Lab Dispersator (4000 RPM), and then it was filtered. The powder was dried at room temperature for 24 hours and at 44° C. for two days. The resulting yield was 95% and the polymer acid number was 150 versus theoretical 151.4 mg KOH/g.

Synthesis of Polymer Y:

Dimethylacetamide (54.5 g), urethane-acrylic intermediate A (9.25 g), acrylonitrile (8.4 g), n-phenyl maleimide (2.0 g), and Vazo-64 (0.175 g) were added to a 500 ml 4-neck ground glass flask, equipped with a heating mantle, temperature controller, mechanical stirrer, condenser, pressure equalized addition funnel and nitrogen inlet. The reaction mixture was heated to 80° C. under nitrogen atmosphere. Then pre-mixture dimethylacetamide (100 g), urethane-acrylic intermediate A (27.5 g), acrylonitrile (25 g), n-phenyl maleimide (5 g), and Vazo-64 (0.525 g) were added over two hours at 80° C. The reaction was continued another ten hours during which Vazo-64 (0.5g) was added in increments. The polymer conversion was >94% based on a determination of percent of non-volatiles. The weight ratio of the polymer of urethane-acrylic intermediate A/acrylonitrile/n-phenyl maleimide was 42/48/10 by weight. The polymer was isolated in powder form in a mixture of water/ice (3:1) using a Lab Dispersator (4000 RPM). The powder was dried overnight at 44° C. The polymer acid number was 70 mg KOH/g.

Synthesis of Polymer Z:

Dimethylacetamide (103 g), acrylonitrile (22.5 g), n-phenyl maleimide (15.0 g), methacrylic acid (7.5 g), N-methoxymethyl methacrylamide (5.0 g), and Vazo-64 (0.5 g) were added to a 1000 ml 4-neck ground glass flask, equipped with a heating mantle, temperature controller, mechanical stirrer, condenser, pressure equalized addition funnel and nitrogen inlet. The reaction mixture was heated to 80° C. under nitrogen atmosphere. Then pre-mixture of dimethylacetamide (200 g), acrylonitrile (67.5 g), n-phenyl maleimide (45 g), methacrylic acid (22.5 g), N-methoxymethyl methacrylamide (15 g), and Vazo-64 (1.0 g) were added over two hours at 80° C. The reaction was continued another fifteen hours during which Vazo-64 (0.8 g) was added in increments. The polymer conversion was >97% based on a determination of percent of non-volatiles. The weight ratio of the polymer of N-methoxymethyl methacrylamide/methacrylic acid/acrylonitrile/n-phenyl maleimide was 10/15/45/30 by weight. The polymer was isolated in powder form in 6000 g of a mixture of water/ice (3:1) using a Lab Dispersator (4000 RPM), and then it was filtered. The powder was dried at room temperature for 24 hours and then dried for 48 hours at 44° C. The polymer acid number was 94 mg KOH/g vs. theoretical 97 mg KOH/g.

Example 1

Negative-Working Imageable Element and Imaging Method

An imageable layer formulation was prepared by dissolving or dispersing 1.8 g of Hybridur® 580 polymer dispersion, 0.5 g of SR399, 0.5 g of NK ester A-DPH, 0.2 g of IB-05, 0.07 g of IRT dye, 0.3 g of Pigment A (951), and 0.02 g of Zonyl® FSN-100 in 1.5 g of BLO, 10 g of MEK, 2 g of methanol, and 0.5 g of water. This formulation was applied to an mechanically-grained and phosphoric acid anodized aluminum substrate that had been post-treated with poly(acrylic acid) to provide a dry coating weight of about 1.2 g/m². The imageable layer formulation was applied using a wire-wound rod and then dried for approximately 60 seconds in a Ranar conveyor oven set at 120° C.

The resulting imageable element was placed on a CREO Trendsetter® 3244x image setter and exposed to an 830 nm IR laser. The imaged element was then developed in a N34 processor charged with 956 Developer (Eastman Kodak Company) at 23° C. The minimum energy to achieve a solid image was about 45 mJ/cm². The resulting printing plate passed both the "DH" and "RH" tests without any reduction in plate developability and speed.

Example 2

Negative-working Imageable Element and Imaging Method

An imageable layer formulation was prepared by dissolving or dispersing 1.8 g of Hybridur® 580 polymer dispersion, 1 g of Polymer C (25% in propanol/water, acid number of 0 mg KOH/g), 0.5 g of SR3 99, 0.5 g of NK ester A-DPH, 0.2 g of IB-05, 0.07 g of IRT dye, 0.03 g of crystal violet, and 0.02 g of Zonyl® FSN-100 in 10 g of MEK, 3 g of propanol, and 2 g of methanol. The imageable layer formulation was applied to an electrochemically gained and sulfuric acid anodized aluminum substrate that had been post-treated with poly(vinyl phosphonic acid) to provide a dry coating weight of about 1.2 g/m². The coating solution was applied using a wire-wound rod and then dried for approximately 60 seconds in a Ranar conveyor oven set at 120°C.

The resulting imageable element was placed on a CREO Trendsetter® 3244x image setter and exposed to an 830 nm IR laser at energies of from 19 to 136 mJ/cm². The imaged element was then developed using D29 Developer. The minimum energy needed to achieve a solid image was about 85 mJ/cm². The resulting printing plate passed both the "DH" and "RH" tests without any reduction in plate developability and speed.

Example 3

Negative-Working Imageable Element and Imaging Method

An imageable layer formulation was prepared by dissolving or dispersing 1.8 g of Hybridur® 580 polymer dispersion, 2.5 g of Graft Copolymer 2 (10% in MEK/PGME at 7:2, acid number of 65 mg KOH/g), 0.5 g of SR399, 0.5 g of NK ester A-DPH, 0.2 g of IB-05, 0.06 g of IRT dye, 0.03 g of crystal violet, and 0.02 g of Zonyl®0 FSN-100 in 10 g of MEK, 0.7 g of PGME, and 2 g of methanol. The imageable layer formulation was applied to an electrochemically grained and sulfuric acid anodized aluminum substrate that had been post-treated with poly(vinyl phosphonic acid) to provide a dry coating weight of about 1.2 g/m². The formulation was applied using a wire-wound rod and then dried for approximately 60 seconds in a Ranar conveyor oven set at 12020 C.

The resulting imageable element was placed on a CREO Trendsetter® 3244x image setter and exposed to an 830 nm IR laser at energies of 19 to 136 mJ/cm². The imaged element was then developed using D29 Developer. The minimum energy to achieve a solid image was about 85 mJ/cm². The resulting printing plate passed both the "DH" and "RH" tests without any reduction in the developability and speed.

Examples 4-10

Negative-Working Imageable Elements with Topcoats

A series of imageable layer formulations were prepared by dissolving or dispersing 1.8 g of Hybridur® 580 polymer dispersion, various amounts of Polymer A (10% in PGME/MEK/water at 5:3:1 ratio, acid number of 98) or Polymer B (10% in PGME/MEK/water at 5:3:1 ratio, acid number of 98 mg KOH/g) shown below in TABLE I, 0.5 g of SR399, 0.5 g of NK ester A-DPH, 0.2 g of IB-01, 0.07 g of IRT dye, 0.03 g of crystal violet, and 0.02 g of Zonyl® FSN-100 in 1.5 g of BLO, 10 g of MEK, 2 g of methanol, and 0.5 g of water. Each of these imageable layer formulations was applied to an mechanically-grained and phosphoric acid anodized aluminum substrate that had been post-treated with poly(acrylic acid), to provide a dry coating weight of about 1.2 g/m². On each resulting imageable layer, a topcoat formulation was applied, comprising 8 g of Elvanol® 5105, 92 g of water, and 0.04 g of Masurf® FS-1520 to provide a dry coating weight of about 1 g/m². Both the formulations were applied using a wire-wound rod and then dried for approximately 60 seconds in a Ranar conveyor oven set at 120° C.

The resulting imageable elements were individually placed on a CREO Trendsetter® 3244x image setter and exposed to an 830 nm IR laser at an exposure energy of 120 mJ/cm². To measure the weight loss in organic solvents, the solid images in the imaged elements were processed using 956 Developer at 23° C. to remove the topcoats. The weight losses of the images in Butyl Cellusolve/water (80/20) at room temperature after 2 minutes soaking are shown below in TABLE I.

A Comparative Example 1, that was a sample of commercially available KODAK SWORD EXCEL printing plate was similarly exposed, developed, and evaluated.

TABLE I

| Example | 10% Polymer A (g) | 10% Polymer B (g) | Weight loss (%) |
|---|---|---|---|
| 4 | 0 | 0 | 4 |
| 5 | 0.75 | 0 | 5.9 |
| 6 | 1.5 | 0 | 6.2 |
| 7 | 2.5 | 0 | 7.4 |
| 8 | 0 | 0.75 | 7.7 |
| 9 | 0 | 1.5 | 7.0 |
| 10 | 0 | 2.5 | 6.3 |
| Comparative Example 1 | KODAK Sword Excel Printing plate | | 7 |

Example 11

No Pre-Heat Negative-Working Imageable Element

An imageable layer formulation was prepared by dissolving or dispersing 1.8 g of Hybridur® 580 polymer dispersion, 0.5 g of SR399, 0.5 g of NK ester A-DPH, 0.2 g of IB-05, 0.07 g of IRT dye, 0.03 g of crystal violet, and 0.02 g of Zonyl® FSN-100 in 1.5 g of BLO, 10 g of MEK, 2 g of methanol, and 0.5 g of water.

This formulation was applied to an electrochemically grained and sulfuric acid anodized aluminum substrate that had been post-treated with poly(vinyl phosphonic acid) to provide a dry coating weight of about 1.2 g/m$^2$. On the resulting imageable layer, a topcoat formulation was applied, comprising 8 g of Elvanol® 5105, 92 g of water, and 0.04 g of Masurf® FS-1520 to provide a dry coating weight of about 1 g/m$^2$. Both formulations were applied using a wire-wound rod and then dried for approximately 60 seconds in a Ranar conveyor oven set at 120°C.

The resulting imageable element was placed on a CREO Trendsetter® 3244x image setter and exposed to an 830 nm IR laser at various exposure energies. The imaged element was then developed using D29 Developer. The minimum exposure energy needed to achieve a solid image was about 40 mJ/cm$^2$. The resulting printing plate passed both the "DH" and "RH" tests without any reduction in the plate developability and speed.

This printing plate was tested on a Miehle sheet-fed press using a wear ink containing 1.5% calcium carbonate and a fountain solution containing Varn Litho Etch 142W at 3 oz./gal (23.4 ml/liter) and PAR alcohol replacement at 3 oz./gal (23.4 ml/liter). A chemical resistance test was performed after 5,000 impressions by applying UV plate cleaner and Varn-120 plate cleaner, in different areas to the image of the plate, washing off the solutions, and resuming the printing after 10 minutes. At 90 and 110 mJ/cm$^2$ exposure energies, all the images recovered within 10 impressions and did not show any degradation from the cleaning solutions. At the end of the workday, the printing plate was cleaned with Aqua-image cleaner/preserver and left mounted on the press until the next morning. Upon start-up, the printing plate performed identically to the previous evening. Under these conditions, the printing plate did not show any solid wear after 55,000 impressions for both exposure energies.

Example 12

Using the same formulations and same coating conditions as described in Example 11, an imageable element was also prepared with an electrochemically grained and sulfuric acid-anodized aluminum substrate that had been post-treated with a solution containing sodium fluoride and sodium dihydrogen phosphate. The resulting imageable element was exposed and developed as described in Example 11, and the imaged element passed both "DH" and "RH" tests without any reduction in the plate developability and speed. The printing plate showed excellent speed and run-length. At an exposure energy of 70 mJ/cm$^2$ and at the full wearing condition, it yielded 43,000 good impressions.

Example 13

An imageable layer formulation was prepared by dissolving or dispersing 1.8 g of Hybridur® 580 polymer dispersion, 0.75 g of Polymer A (10% in MEK/PGME/BLO/water at 5:2:1:1 ratio, acid number of 98 mg KOH/g), 0.5 g of SR399, 0.5 g of NK ester A-DPH, 0.2 g of IB-05, 0.07 g of IRT dye, 0.03 g of crystal violet, and 0.02 g of Zonyl® FSN-100 in 1.5 g of BLO, 10 g of MEK, 2 g of methanol, and 0.5 g of water. The formulation was applied to an electrochemically grained and sulfuric acid anodized aluminum substrate that had been post-treated with poly(vinyl phosphonic acid) to provide a dry coating weight of about 1.2 g/m$^2$. On the resulting imageable layer, a topcoat formulation was applied, comprising 8 g of Elvanol® 5105, 92 g of water, and 0.04 g of Masurf® FS-1520 to provide a dry coating weight of about 1 g/m$^2$. Both formulations were applied using a wire-wound rod and then dried for approximately 60 seconds in a Ranar conveyor oven set at 120 °C.

The resulting imageable element was placed on a CREO Trendsetter® 3244x image setter and exposed to an 830 nm IR laser at various exposure energies. The imaged element was then developed using D29 Developer. The minimum energy to achieve a solid image was about 40 mJ/cm$^2$.

A developed printing plate was tested on Miehle sheet-fed press using a wear ink containing 1.5% calcium carbonate and fountain solution containing Varn Litho Etch 142W at 3 oz./gal (23.4 ml/liter) and PAR alcohol replacement at 3 oz./gal (23.4 ml/liter). A chemical resistance test was performed after 5,000 impressions by applying UV plate cleaner and Varn-120 plate cleaner, in different areas to the image of the plate and resuming the printing without any cleaning after 10-15 minutes. At the 90 and 110 mJ/cm$^2$ exposure energies, all of the images recovered after 10 impressions and did not show any degradation from the plate cleaners. At the end of the workday, the printing plate was cleaned with Aqua-image cleaner/preserver and left mounted on the press for two nights. Upon start-up the following morning, the printing plate performed identically to the previous evening. At the fully wearing condition, the printing plate did not show any solid wear after 55,000 impressions for both exposure energies. This printing plate also passed both "DH" and "RH" tests identified above without any reduction in plate developability and speed.

Example 14

An imageable layer formulation was prepared by dissolving or dispersing 0.95 g of Hybridur® 580 polymer dispersion, 3 g of Polymer A (10% in MEK/PGME/BLO/water at 5:2:1:1 ratio, acid number of 98 mg KOH/g), 0.5 g of SR399, 0.5 g of NK ester A-DPH, 0.2 g of IB-05, 0.07 g of IRT, 0.03 g of crystal violet, and 0.02 g of Zonyl® FSN-100 in 1.5 g of BLO, 8 g of MEK, 2 g of methanol, and 0.5 g of water. This formulation was applied to an electrochemically grained and sulfuric acid anodized aluminum substrate that had been post-treated with poly(vinyl phosphonic acid) to provide a dry coating weight of about 1.2 g/m$^2$. On the resulting imageable layer, a topcoat formulation comprising 8 g of Elvanol® 5105, 92 g of water, and 0.04 g of Masurf® FS-1520 was applied to provide a dry coating weight of about 1 g/m². Both the imageable layer and topcoat formulations were applied using a wire- wound rod and then dried for approximately 60 seconds in a Ranar conveyor oven set at 120° C.

The resulting imageable element was placed on a CREO Trendsetter® 3244x image setter and exposed using an 830 nm IR laser. The imaged element was then developed on a N34 processor charged with 956 Developer at 23° C. The minimum exposure energy needed to achieve a solid image was about 40 mJ/cm².

A developed printing plate was tested on Miehle sheet-fed press using a wear ink containing 1.5% calcium carbonate and fountain solution containing Varn Litho Etch 142W at 3 oz./gal (23.4 ml/liter) and PAR alcohol replacement at 3 oz./gal. (23.4 ml/liter). A chemical resistance test was performed at 5,000 impressions by applying UV plate cleaner and Varn-120 plate cleaner, in different areas to the image of the plate and resuming the printing without any cleaning after 10-15 minutes. At the 90 and 110 mJ/cm² exposure energies, all the images recovered at 10 impressions and only showed some moderate attack due to the UV plate cleaner. At the end of the workday, the printing plate was cleaned with Aqua-image cleaner/preserver and left mounted on the press until the next morning. Upon start-up, the printing plate performed identically to the previous evening. At the fully wearing condition, the printing plate was able to give 27,000 and 29,000 good impressions at the exposures of 90 and 110 mJ/cm². This printing plate passed both of the noted "DH" and "RH" tests without any reduction in the developability and speed.

Example 15

An imageable layer formulation was prepared by dissolving or dispersing 1.8 g of Hybridur® 580 polymer dispersion, 0.5 g of SR399, 2.5 g of Polymer X (10% in MEK/PGME/BLO/water at 5:2:1:1 ratio, acid number 136mg KOH/g), 0.5 g of NK ester A-DPH, 0.2 g of IB-05, 0.07 g of IRT, 0.03 g of crystal violet, and 0.02 g of Zonyl® FSN-100 in 1.5 g of BLO, 10 g of MEK, 2 g of methanol, and 0.5 g of water. This formulation was applied to an electrochemically grained and sulfuric acid anodized aluminum substrate that had been post-treated with poly(vinyl phosphonic acid) to provide a dry coating weight of about 1.2 g/m². On this imageable layer, a topcoat formulation comprising 8 g of Elvanol® 5105, 92 g of water, and 0.04 g of Masurf® FS-1520 was applied to provide a dry coating weight of about 1 g/m². Both the imageable layer and topcoat formulations were applied using a wire-wound rod and then dried for approximately 60 seconds in a Ranar conveyor oven set at 120°C.

The resulting imageable element was placed on a CREO Trendsetter® 3244x image setter and exposed using an 830 nm IR laser. The imaged element was then developed on a N34 processor charged with 956 Developer at 23° C. The minimum exposure energy to achieve a solid image was about 45 mJ/cm². The developed printing plate passed both of the noted "DH" and "RH" tests without any reduction in the plate developability and speed.

Example 16

An imageable layer formulation was prepared by dissolving or dispersing 1.8 g of Hybridur®580 polymer dispersion, 0.5 g of SR399, 2.5 g of Polymer Y (10% in MEK/PGME/BLO/water at 5:2:1:1 ratio, acid number 59mg KOH/g), 0.5 g of NK ester A-DPH, 0.2 g of IB-05, 0.07 g of IRT, 0.03 g of crystal violet, and 0.02 g of Zonyl® FSN-100 in 1.5 g of BLO, 10 g of MEK, 2 g of methanol, and 0.5 g of water. This formulation was applied to an electrochemically gained and sulfuric acid anodized aluminum substrate that had been post-treated with poly(vinyl phosphonic acid) to provide a dry coating weight of about 1.2 g/m². On the resulting imageable layer, a topcoat formulation comprising 8 g of Elvanol® 5105, 92 g of water, and 0.04 g of Masurf® FS- 1520 was applied to provide a dry coating weight of about 1 g/m². Both the imageable layer and topcoat formulations were applied using a wire-wound rod and then dried for approximately 60 seconds in a Ranar conveyor oven set at 120°C.

The resulting imageable element was placed on a CREO Trendsetter® 3244x image and exposed using an 830 nm IR laser. The imaged element was then developed with D29 developer. The minimum exposure energy to achieve a solid image was about 40 mJ/cm². The resulting printing plate passed both of the noted "DH" and "RH" tests without any reduction in the printing plate developability and speed.

Example 17

An imageable layer formulation was prepared by dissolving or dispersing 1.8 g of Hybridur® 580 polymer dispersion, 0.5 g of SR399, 2.5 g of Polymer Z (10% in MEK/BLO/water at 6:2:1 ratio, acid number 97 mg KOH/g), 0.5 g of NK ester A-DPH, 0.2 g of IB-05, 0.07 g of IRT, 0.03 g of crystal violet, and 0.02 g of Zonyl® FSN-100 in 1.5 g of BLO, 10 g of MEK, 2 g of methanol, and 0.5 g of water. This formulation was applied to an electrochemically grained and sulfuric acid anodized aluminum substrate that had been post-treated with poly(vinyl phosphonic acid) to provide a dry coating weight of about 1.2 g/m². On the resulting imageable layer, a topcoat formulation comprising 8 g of Elvanol® 5105, 92 g of water, and 0.04 g of Masurf® FS-1520 was applied to provide a dry coating weight of about 1 g/m². Both the imageable layer and topcoat formulations were applied using a wire-wound rod and then dried for approximately 60 seconds in a Ranar conveyor oven set at 120° C.

The resulting imageable element was placed on a CREO Trendsetter® 3244x image setter and exposed using an 830 nm IR laser. The imaged element was then developed using D29 developer. The minimum exposure energy to achieve a solid image was about 40 mJ/cm². The resulting printing plate passed both of the noted "DH" and "RH" tests without any reduction in the plate developability and speed.

Example 18

An imageable layer formulation was prepared by dissolving or dispersing 1.1 g of Hybridur® 580 polymer dispersion, 3.3 g of Polymer A (10% in MEK/PGME/BLO/water at 5:2:1:1 ratio, acid number of 98mg KOH/g), 0.5 g of SR399, 0.5 g of NK ester A-DPH, 0.1 g of Phosmer PE, 0.15 g of IB-05, 0.07 g of IRT, 0.3 g of Pigment 951 (27% in PGME) and 0.02 g of FSN-100, 1.5 g of BLO, 8 g of MEK, 2 g of methanol, and 0.5 g of water. This formulation was applied to an electrochemically grained and sulfuric acid anodized aluminum substrate that had been post-treated with poly(vinyl phosphonic acid) to provide a dry coating weight of about 1.2 g/m² . On the resulting imageable layer, a topcoat formulation comprising 4 g of Elvanol® 5105, 96 g of water, and 0.02 g of Masurf® FS- 1520 was applied to provide a dry coating weight of about 0.4 g/m². Both formulations were applied using a wire-wound rod and then dried for approximately 60 seconds in a Ranar conveyor oven set at 120°C.

The resulting imageable element was placed on a CREO Trendsetter® 3244× image setter and exposed using an 830 nm IR laser. The imaged element was then developed using a N34 processor charged with a 956 developer at 23° C. The minimum energy needed to achieve a solid image was about 20 mJ/cm$^2$.

A developed printing plate was tested on Miehle sheet-fed press using a wear ink containing 1.5% calcium carbonate and fountain solution containing Varn Litho Etch 142W at 3 oz./gal. (23.4 ml/liter) and PAR alcohol replacement at 3 oz./gal. (23.4 ml/liter). A chemical resistance test was performed at 5,000 impressions by applying UV plate cleaner and Varn-120 plate cleaner, in different areas to the image of the printing plate and resuming the printing without any cleaning after 10-15 minutes. With an exposure of 90 mJ/cm$^2$, the image recovered after 10 impressions and did not show any degradation from the plate cleaners. At the end of the workday, the printing plate was cleaned with Aqua-image cleaner/preserver and left mounted on the press until the next morning. Upon start-up, the printing plate performed identically to the previous evening. The same result was achieved after a weekend break also. At the fully wearing condition, the printing plate did not show any solid wear and highlight fading (AM200) after 45,000 impressions. The printing plate passed both 5-day DH and RH tests described above without any reduction in the plate developability and imaging speed. It did not show any fogging after a 16-hour exposure to yellow light and 8-hour exposure to white light.

Example 19

An imaging layer formulation was prepared by dissolving or dispersing 1.1g of Hybridur® 580 polymer dispersion, 3.3 g of Polymer A (10% in MEK/PGME/BLO/water at 5:2:1:1 ratio, acid number of 98 mg KOH/g), 0.5 g of SR399, 0.5 g of NK ester A-DPH, 0.1 g of Phosmer PE, 0.12 g of Triazine A, 0.055 g of 66e, 0.035 g of ADAA, 0.3 g of Pigment 951 (27% in PGME), 0.4 g of FluorN2900 (5% in PGME), 1.5 g of BLO, 8 g of MEK, 2 g of methanol, and 0.5 g of water. The formulation was applied to an electrochemically grained and sulfuric acid anodized aluminum substrate that had been post-treated with poly(vinyl phosphonic acid) to provide a dry coating weight of about 1.2 g/m$^2$. On the resulting imageable layer, a topcoat formulation comprising 8 g of Elvanol® 5105, 92 g of water, and 0.04 g of Masurt® FS-1520 was applied to provide a dry coating weight of about 0.8 g/m$^2$. Both formulations were applied using a wire-wound rod and then dried for approximately 60 seconds in a Ranar conveyor oven set at 120°C.

The resulting imageable element was placed on a CREO Trendsetter® 3244x image setter and exposed using an 830 nm IR laser. The imaged element was then developed using a N34 processor charged with 956 Developer at 23° C. The minimum exposure energy to achieve a solid image was about 40 mJ/cm$^2$. The resulting imaged and developed printing plate passed both 5-day DH and RH tests described above.

Example 20

An imageable layer formulation was prepared by dissolving or dispersing 1.1 g of Hybridur® 870 polymer dispersion, 3.3 g of Polymer A (10% in MEK/PGME/BLO/water at 5:2:1:1 ratio, acid number of 98mg KOH/g), 0.5 g of SR399, 0.5 g of NK ester A-DPH, 0.1 g of Phosmer PE, 0.2 g of IB-05, 0.07 g of IRT dye, 0.3 g of Pigment 951 (27% in PGME), and 0.02 g of FSN-100 in 1.5 g of BLO, 8 g of MEK, 2 g of methanol, and 0.5 g of water. This formulation was applied to an electrochemically grained and sulfuric acid anodized aluminum substrate that had been post-treated with poly(vinyl phosphonic acid) to provide a dry coating weight of about 1.2 g/m$^2$. On the resulting imageable layer, a topcoat formulation comprising 4 g of Elvanol® 5105, 96 g of water, and 0.02 g of Masurt® FS-1520 was applied to provide a dry coating weight of about 0.4 g/m$^2$. Both formulations were applied using a wire-wound rod and then dried for approximately 60 seconds in a Ranar conveyor oven set at 120°C.

The resulting imageable element was placed on a CREO Trendsetter® 3244x image setter and exposed using an 830 nm IR laser. The imaged element was then developed using a N34 processor charged with 956 Developer at 23° C. The minimum exposure energy needed to achieve a solid image was about 20 mJ/cm$^2$.

The developed plate was tested on Miehle sheet-fed press using a wear ink containing 1.5% calcium carbonate and fountain solution containing Varn Litho Etch 142W at 3 oz./gal. (23.4 ml/liter) and PAR alcohol replacement at 3 oz./gal. (23.4 ml/liter). A chemical resistance test was performed at 5,000 impressions by applying UV plate cleaner and Varn-120 plate cleaner, in different areas to the image of the plate and resuming the printing without any cleaning after 10-15 minutes. Using an exposure energy of 90 mJ/cm$^2$, the image recovered with 10 impressions and did not show any degradation on the solid images due to the plates cleaners. At the end of the workday, the printing plate was cleaned with Aqua-image cleaner/preserver and left mounted on the press until the next morning. Upon start-up, the printing plate performed identically to the previous evening. At the fully wearing condition, the plate did not show any solid wear and highlight fading (AM200) at 46,000 impressions. The printing plate also passed both 5-day DH and RH tests noted above without any reduction in the plate developability and speed.

Examples 21-22

An imageable layer formulation was prepared by dissolving or dispersing 1.95 g of Hybridur® 580 polymer dispersion, 0.5 g of SR3 99, 0.5 g of NK ester A-DPH, 0.1 g of Phosmer PE, 0.2 g of IB-05, 0.07 g of IRT dye, 0.3 g of Pigment 951 (27% in PGME), and 0.4 g of FluorN2900 (5% in PGME) in 7.5 g of PGME, 2.5 g of BLO, 12 g of MEK, 2 g of methanol, and 2 g of water. This formulation was applied to an electrochemically grained and sulfuric acid anodized aluminum substrate that had been post-treated with poly(vinyl phosphonic acid) to provide a dry coating weight of about 1.2 g/m$^2$. On the resulting imageable layer, a topcoat formulation comprising 2 g of Elvanol® 5105, 4 g of IPA, 94 g of water, and 0.01 g of Masurt® FS-1520 was applied to provide a dry coating weight of about 0.4 g/m$^2$. Both formulations were applied using a wire-wound rod and then dried for approximately 60 seconds in a Ranar conveyor oven set at 120°C.

The resulting imageable element was placed on a CREO Trendsetter® 3244x image setter and exposed using an 830 nm IR laser.

For Example 21, the imaged element was put in a developing sink and rinsed with warm water of about 45° C. It was developed by rubbing with a brush or a cloth under pressure in this warm water. The minimum exposure energy needed to achieve a solid image was about 20 mJ/cm$^2$. Applying drops of either Prisco LPC or UV plate cleaner to the solid image for 1 minute showed that the water-developed imaged element had good resistance to pressroom chemicals.

For Example 22, the imaged element was mounted on an ABDick duplicator press charged with fountain solution containing Varn Litho Etch 142W at 3 oz./gal. (23.4 ml/liter) and PAR alcohol replacement at 3 oz./gal. (23.4 ml/liter) and van Son Rubber Base black ink VS151. The imaged element was developed after 300 impressions under the application of the both fountain solution and ink and another 500 impressions were printed and showed strong images of both solid and highlights using exposure energies as low as 50 mJ/cm$^2$.

Examples 23-25

An imageable layer formulation was prepared by dissolving or dispersing 1.1 g of Hybridur® 580 polymer dispersion, 3.3 g of Polymer A (10% in MEK/PGME/BLO/water at 5:2:1:1 ratio, acid number of 98 mg KOH/g), 0.5 g of SR399, 0.5 g of NK ester A-DPH, 0.1 g of Phosmer PE, 0.2 g of IB-05, 0.07 g of IRT, 0.3 g of Pigment 951 (27% in PGME), and 0.4 g of FluorN2900 (5% in PGME) in 7.5 g of PGME, 2.5 g of BLO, 12 g of MEK, 2 g of methanol, and 2 g of water. This formulation was applied to an electrochemically grained and sulfuric acid anodized aluminum substrate that had been post-treated with poly(vinyl phosphonic acid) to provide a dry coating weight of about 1.2 g/m$^2$. On the resulting imageable layer, a topcoat formulation comprising 2 g of Elvanol® 5105, 4 g of IPA, 94 g of water, and 0.01 g of Masurf® FS-1520 was applied to provide a dry coating weight of about 0.4 g/m$^2$. Both formulations were applied using a slot coater and then dried at approximately 83° C. for about 90 seconds.

The resulting imageable element was placed on a CREO Trendsetter® 3244x image setter and exposed using an 830 nm IR laser.

For Example 23, the imaged element was developed by hand in a developing sink by rinsing with warm water (about 45° C.). Another sample of the same imaged element was developed by rubbing it with a brush or a cloth under pressure. Still another sample of the imaged element was developed in a processor, a desktop processor Anitec Duplex 16 that was charged with a warm water of about 50° C., at a speed of about 80 cm/min. The minimum exposure energy to achieve a solid image was about 20 mJ/cm$^2$. A 1-minute drop test (as carried out in Examples 21-22) showed that the water-developed printing plate had good resistance to press room chemicals.

For Example 24, the imaged element was mounted on an ABDick duplicator press. Before printing, Prisco LPC was applied by spray and quickly wiped using a Webril Wipe until it was processed. Then, the resultant printing surface was dampened with fountain solution containing Varn Litho Etch 142W at 3 oz./gal. (23.4 ml/liter) and PAR alcohol replacement at 3 oz./gal. (23.4 ml/liter) that was followed by the application of van Son Rubber Base black ink VS151. Five hundred good impressions were made that showed strong images of both solid and highlights with the exposure energies greater than 80 mJ/cm$^2$.

For Example 25, the imaged element was mounted on an ABDick duplicator press charged with fountain solution containing Varn Litho Etch 142W at 3 oz./gal. (23.4 ml/liter) and PAR alcohol replacement at 3 oz./gal. (23.4 ml/liter) and van Son Rubber Base black ink VS151. The imaged element was developed at 300 impressions under the application of the both fountain solution and ink. Five hundred good impressions were printed that showed strong images of both solid and highlights with the exposure energies as low as 50 mJ/cm$^2$.

Examples 26-29

Imageable layer formulations were prepared using the components described below in TABLE II and each was applied to electrochemically grained sulfuric acid anodized aluminum that had been post-treated with a monosodium phosphate solution containing sodium fluoride to provide a dried having a film weight of 1.6 g/m$^2$. Each of the resulting imageable layers were then coated with a solution comprising of 5.64% poly(vinyl alcohol) (88% hydrolyzed), 0.3% poly(vinyl pyrrolidone), 3.76% isopropanol, and 90.3% water and dried to provide a topcoat with a film weight of 1.9 g/m$^2$.

The resulting imageable element for Example 26 was imaged on a Fuji Luxel Vx-9600 platesetter at an exposure energy of 83 µJ/cm$^2$ and processed using Eastman Kodak Company T190-4 Developer. The imaged printing plate was used to print 2,000 impressions on a Miehle press without any indication of degradation of the printed images.

The resulting imageable element for Example 27 was imaged on a Fuji Luxel Vx-9600 platesetter at an exposure energy of 193 µJ/cm$^2$ and processed using Eastman Kodak Company 955 Developer. The resulting printing plate was used to print 1,000 impressions on a Miehle press with abrasive ink and did not exhibit any degradation of the 1% highlight dots at the conclusion of the test.

The resulting imageable element for Example 28 was imaged on a Fuji Luxel Vx-9600 platesetter at an exposure energy of 44 µJ/cm$^2$ and processed using 955 Developer. The resulting printing plate was used to print 15,000 impressions on a Miehle press with abrasive ink without exhibiting any wear. The resulting imageable element for Example 29 was imaged with 8×8 pixels on a Fuji Luxel Vx-9600 platesetter with a series of exposure energies from 1.8 to 185 µJ/cm$^2$ and processed using 955 Developer. Printed impressions produced on an A B Dick 9870 duplicator press demonstrated that uniform 8×8 pixels could be obtained at exposure energies as low as 11 µJ/cm$^2$.

TABLE II

| Component | Example 26 | Example 27 | Example 28 | Example 29 |
|---|---|---|---|---|
| Hybridur® 580 polymer dispersion | 3.53 | 2.08 | 4.61 | 2.57 |
| Copolymer 1 | 0 | 0.83 | 0 | 0 |
| Copolymer 2 | 0 | 0 | 0.20 | 0 |
| Copolymer 3 | 0 | 0 | 0 | 1.03 |
| HB-NK Ester BPE 500 | 0.47 | 0.55 | 0 | 0 |
| SR-349 | 0 | 0 | 1.33 | 1.33 |
| Oligomer 1 | 8.59 | 10.09 | 4.44 | 4.45 |
| Kayamer PM-2 | 0.06 | 0.07 | 0 | 0 |
| Phosmer PE | 0 | 0 | 0.07 | 0.07 |
| 2-Phenyl-5-(4-di-ethylaminophenyl)-4-(2-chlorophenyl)-oxazole | 0.88 | 1.03 | 0.92 | 0.93 |
| 2,2'-Bis(2-chlorophenyl)-4,4',5,5'-tetraphenyl-biimidazole | 0.21 | 0.25 | 0.22 | 0.22 |
| 3-Mercapto-1,2,4-triazole | 0.39 | 0.46 | 0.41 | 0.41 |
| Pigment A | 0.88 | 1.03 | 0.93 | 1.12 |
| Byk® 307 | 0.01 | 0.01 | 0.01 | 0.01 |
| n-Propanol | 62.64 | 60.55 | 0 | 0 |
| 1-Methoxy-2-propanol | 0 | 0 | 47.82 | 48.83 |
| 2-Butanone | 20.63 | 20.38 | 20.55 | 20.54 |
| Ethyl acetate | 1.49 | 0.35 | 0 | 0 |
| Water | 0.22 | 2.32 | 0 | 0 |
| Dimethylacetamide | 0 | 0 | 18.49 | 18.49 |

The invention has been described in detail with particular reference to certain preferred embodiments thereof, but it will be understood that variations and modifications can be effected within the spirit and scope of the invention.

The invention claimed is:

1. A radiation-sensitive composition comprising:
a free radically polymerizable component,
an initiator composition capable of generating radicals sufficient to initiate polymerization of said free radically polymerizable component upon exposure to imaging radiation,
a radiation absorbing compound, and
particles of a poly(urethane-acrylic) hybrid that are distributed throughout said composition.

2. The composition of claim 1 wherein said hybrid has a molecular weight of from about 50,000 to about 500,000 and said hybrid particles have an average particle size of from about 30 to about 500 nm.

3. The composition of claim 1 wherein said hybrid comprises from about 10 to about 70 weight % of said composition, based on total composition dry weight.

4. The composition of claim 1 wherein a 0.1 g of said hybrid particles are insoluble when shaken for 24 hours at 20° C. in an 80% aqueous solution of either 2-butoxyethanol or 4-hydroxy-4-methyl-2-pentanone.

5. The composition of claim 1 further comprising a polymeric binder other than said poly(urethane-acrylic) hybrid particles.

6. The composition of claim 5 wherein said polymeric binder represents from about 1.5 to about 40 weight %, based on the total composition solids.

7. The composition of claim 5 wherein said polymeric binder comprises recurring units derived from one or more of the following ethylenically unsaturated polymerizable monomers:

monomers with pendant carboxy groups, (meth)acrylates, styrene and styrene derivatives, vinyl acetal, N-substituted cyclic imides, maleic anhydride, vinyl carbazoles, monomers with multiple vinyl groups, (meth)acrylonitriles, (meth)acrylamides, poly(alkylene glycols), poly(alkylene glycol)(meth)acrylates, and N-substituted (meth)acrylamides.

8. The composition of claim 1 wherein said initiator composition comprises an onium salt.

9. The composition of claim 8 wherein said onium salt is present in an amount of at least 0.05 weight % and comprises an iodonium borate comprising a diaryliodonium borate compound represented by the following Structure (II):

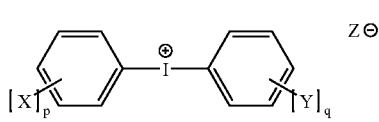

wherein X and Y are independently halo, alkyl, alkyloxy, or cycloalkyl groups, or two or more adjacent X or Y groups can be combined to form a fused ring with the respective phenyl rings, p and q are independently 0 or integers of 1 to 5, provided that either p or q is from about 1, and $Z^-$ is an organic anion represented by the following Structure (III):

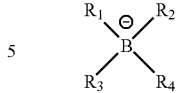

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom.

10. The composition of claim 8 wherein X and Y are independently alkyl, alkyloxy, or cycloalkyl groups, both p and q is from about 1, and $R_1$, $R_2$, $R_3$, and $R_4$ are independently alkyl or aryl groups.

11. The composition of claim 1 wherein said initiator composition comprises a triazine and a mono- or polycarboxylic acid or mercaptan as a co-initiator.

12. The composition of claim 1 wherein said free radically polymerizable component comprises an ethylenically unsaturated free-radical polymerizable monomer or oligomer, or a free-radical crosslinkable polymer, and said radiation absorbing compound is an infrared radiation absorbing compound.

13. A negative-working imageable element comprising a substrate having thereon an imageable layer comprising:
a free radically polymerizable component,
an initiator composition capable of generating radicals sufficient to initiate polymerization of said free radically polymerizable component upon exposure to imaging radiation,
a radiation absorbing compound, and
particles of a poly(urethane-acrylic) hybrid that are distributed throughout said imageable layer.

14. The element of claim 13 wherein said hybrid has a molecular weight of from about 50,000 to about 500,000 and said hybrid particles have an average particle size of from about 30 to about 500 nm, and said hybrid comprises from about 10 to about 50 weight % of said imageable layer, based on total imageable layer dry weight.

15. The element of claim 13 wherein said initiator composition comprises an onium salt, said free radically polymerizable component comprises an ethylenically unsaturated free-radical polymerizable monomer or oligomer, or a free-radical crosslinkable polymer, and said radiation absorbing compound is an infrared radiation absorbing compound.

16. The element of claim 15 wherein said onium salt is an iodonium borate comprising a diaryliodonium borate compound represented by the following Structure (II):

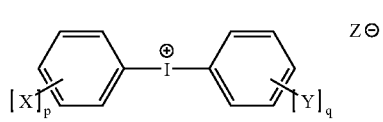

wherein X and Y are independently halo, alkyl, alkyloxy, or cycloalkyl groups or two or more adjacent X or Y groups can be combined to form a fused ring with the respective phenyl rings, p and q are independently 0 or integers of 1 to 5, provided that either p or q is from about 1, and $Z^-$ is an organic anion represented by the following Structure (III):

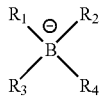 (III)

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom.

17. The element of claim 13 further comprising a topcoat disposed over said imageable layer.

18. The element of claim 13 wherein said initiator composition comprises a triazine and a mono- or polycarboxylic acid or mercaptan as a co-initiator.

19. The element of claim 13 that is sensitive to imaging radiation having a wavelength of at least 250 nm and up to and including 450 nm, and said radiation absorbing compound is a 2,4,5-triaryloxazole derivative.

20. The element of claim 19 wherein said initiator composition comprises a hexaarylbiimidazole.

21. A method of making an imaged element comprising:
A) imagewise exposing the negative-working imageable element of claim 13 to form exposed and non-exposed regions,
B) with or without a preheat step, developing said imagewise exposed element to remove only said non-exposed regions, and
C) optionally heating said imaged and developed element or subjecting it to floodwise UV exposure.

22. The method of claim 21 wherein said radiation absorbing compound is an IR-sensitive dye and said imagewise exposing step A is carried out using radiation having a maximum wavelength of from about 700 to about 1200 nm at an energy level of from about 20 to about 500 mJ/cm$^2$.

23. The method of claim 21 that is carried out without a preheat step, and said developing is carried out using an organic solvent-based developer.

24. The method of claim 21 wherein said developing is carried out using water or a plate cleaner.

25. The method of claim 21 wherein said imageable element is developed, or exposed and developed, on-press.

26. An imaged element obtained from the method of claim 21.

* * * * *